United States Patent [19]

Weber

[11] 3,848,199

[45] Nov. 12, 1974

[54] FREQUENCY GENERATING DEVICE UTILIZING A PHASE LOCKED LOOP INCLUDING A VOLTAGE CONTROL OSCILLATOR

[75] Inventor: Charles L. Weber, Chanute, Kans.

[73] Assignee: Kustom Electronics, Inc., Chanute, Kans.

[22] Filed: Nov. 16, 1973

[21] Appl. No.: 416,412

Related U.S. Application Data

[63] Continuation of Ser. No. 213,948, Dec. 30, 1971, abandoned.

[52] U.S. Cl. .......... 331/2, 331/4, 331/19, 331/22

[51] Int. Cl. .......... H03b 3/04

[58] Field of Search .......... 331/2, 11, 12, 19, 22, 331/31, 4

[56] References Cited

UNITED STATES PATENTS

| | | | |
|---|---|---|---|
| 2,685,032 | 7/1954 | Cox | 331/22 |
| 2,924,706 | 2/1960 | Sassler | 331/22 |
| 3,075,157 | 1/1963 | Fisher et al. | 331/22 |

*Primary Examiner*—John Kominski

*Attorney, Agent, or Firm*—Lowe, Kokjer, Kirchner, Wharton & Bowman

[57] ABSTRACT

A frequency generating device has a phase-locked loop that is operable to cause an associated VCO to lock at the arithmetic means of two input frequencies applied to the loop. By mixing the frequency of the VCO with the two input frequencies in separate mixers, the mixer outputs may be used as inputs to a phase detector. The output of the phase detector is then utilized to lock the VCO output to said arithmetic mean as the difference frequencies from the mixers are only equal at that particular mean value. However, by using dividers located between mixers and the phase detector inputs, it is possible to lock the VCO to some frequency other than the arithmetic mean so long as its value is somewhere between the two input frequencies.

6 Claims, 1 Drawing Figure

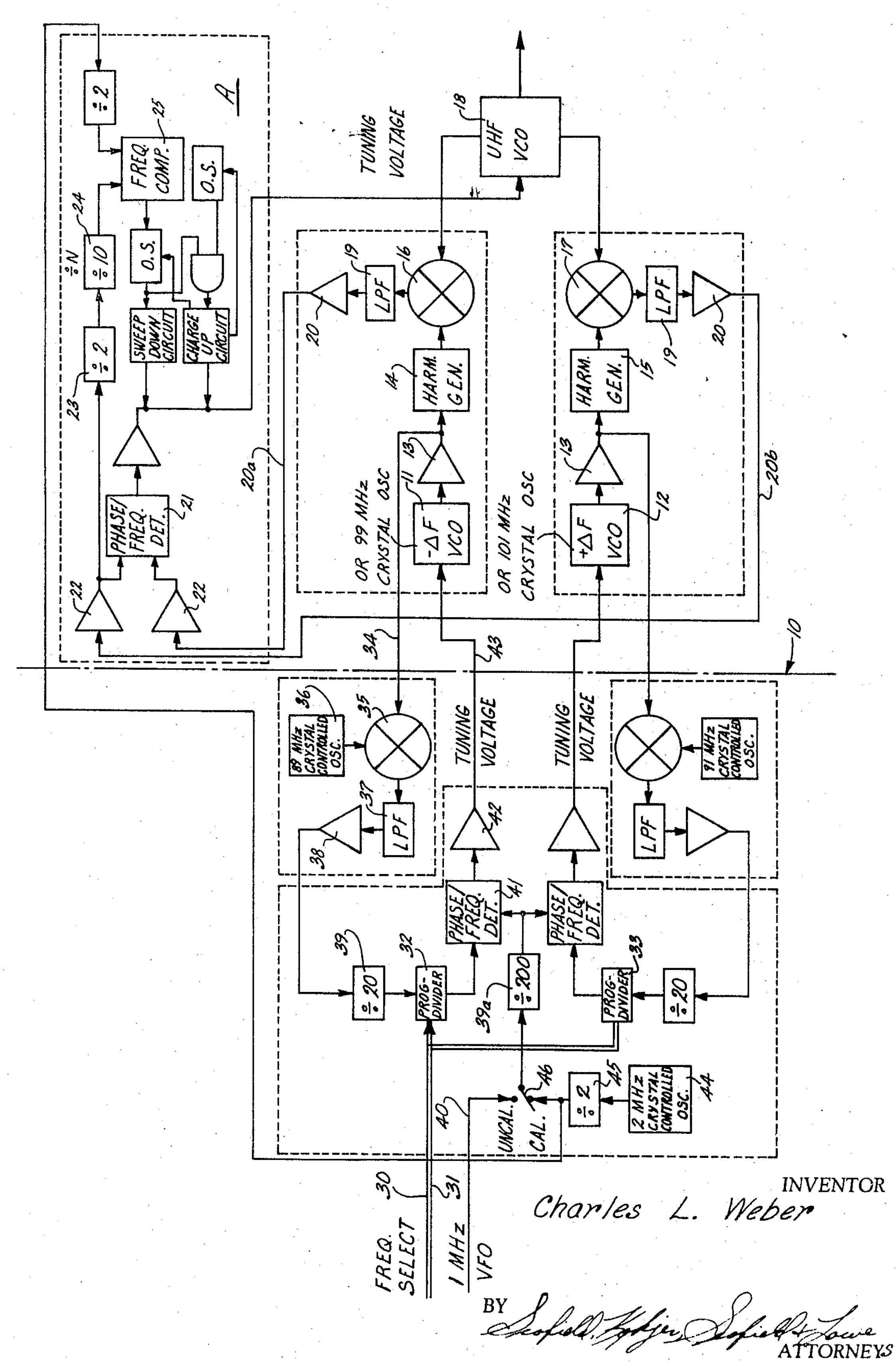
INVENTOR
Charles L. Weber
BY Scofield, Kokjer, Scofield & Lowe
ATTORNEYS

FREQUENCY GENERATING DEVICE UTILIZING A PHASE LOCKED LOOP INCLUDING A VOLTAGE CONTROL OSCILLATOR

This is a continuation of application Ser. No. 213,948, filed Dec. 30, 1971, and now abandoned.

BACKGROUND AND BRIEF DESCRIPTION OF THE INVENTION

My invention relates primarily to a unique method and associated circuitry utilizable in the testing of avionics equipment and pertains more particularly to DME (distance measuring equipment) testing equipment that is capable of frequency generation in the 960 to 1,215 Mhz.

Known test units produced desired frequencies either by multiplying a generated frequency in the 100 Mhz range (and below) or, alternatively, a voltage controlled oscillator (VCO) or is utilized by dividing the output frequency thereof by means of a regenerative divider. In some instances, frequency injection techniques were utilized with running oscillators.

With the above-described methods, a common problem existed in the alignment of same. For instance, the regenerative divider would put out spurious frequencies causing the VCO to operate on an undesired frequency. The injection locked oscillator technique proved to be band width limited and again presented alignment problems as did a frequency multiplication scheme. Since these methods (that produced alignment problems) likewise generated spurious outputs, satisfactory testing procedures were very difficult to maintain.

My invention relates to the method and apparatus for producing an avionics and/or DME test signal in the range of 960 to 1,215 Mhz having a clean and extremely usable output spectrum in the above-mentioned test range. My invention includes the utilization of a phase locked loop which is operative to cause a voltage control oscillator (VCO) to lock at the arithmetic mean to two input frequencies which are applied thereto. By further mixing the frequency of the VCO with the two input frequencies, the mixer outputs may be used as inputs to a phase detector so that the output of same will cause the VCO output to lock at the arithmetic mean. This results primarily because the difference frequencies from the mixers are only equal at that particular mean value. However, it is contemplated that dividers may be used between the mixers and the phase detector inputs thereby making it possible to lock the VCO at some frequency other than the arithmetic mean so long as its value is somewhere between two input frequencies.

A primary object of the invention is to provide a uniquely constructed device and method for generating a frequency in a preselected frequency range.

Another object of the invention is to provide a uniquely constructed device for frequency generation that has a more usable output spectrum and which is more stable in an operative sense.

A further object of the invention is to provide a circuit for testing distance measuring equipment which will lessen the production test time and reduce field problems generally associated with equipment of a similar nature which are more susceptible to alignment problems.

A still further object of my invention is to provide a uniquely constructed device of the character described which requires little service or adjustment and which is relatively inexpensive to manufacture.

A more particular object of the invention is to provide a uniquely constructed device for causing the output of a VCO to lock to the arithmetic mean of two input frequencies. It is a feature of this object that, by the inclusion of dividers, the device may be made to cause the VCO to lock at some other frequency between the two input frequencies.

A still further object of the invention is to provide a unique device for generating frequencies in the gigahz region which are extremely stable and not critically subject to drift and other associated nonalignment problems.

Another object of my invention is to provide a unique method for producing a selected frequency that includes mixing a variable frequency with two input frequencies in separate mixers, and causing the mixer outputs to be equal only when the variable frequency is the arithmetic mean of the input frequencies.

A further object of my invention is to provide a unique method of the character described including the step of feeding the difference frequencies from the separate mixers to inputs of a phase frequency detector, and utilizing the output of the phase frequency detector for controlling a VCO to drive the output of same to the arithmetic mean of the two input frequencies.

Other and further objects of the invention, together with the feature of novelty appurtenant thereto, will appear in the course of the following description.

DETAILED DESCRIPTION OF THE INVENTION

In the accompanying drawing, which forms a part of the specification and is to be read in conjunction therewith and in which like reference numerals are employed to indicate like parts in the various views:

FIG. 1 is a schematic circuit diagram of the subject invention with the right-hand portion thereof depicting the basic portion of the invention and, when combined with the left-hand portion, showing the utilization of same in the avionics or DME test art.

As shown in the right-hand portion of FIG. 1 (to the right of the broken line identified by the numeral 10), a pair of oscillators 11 and 12 are employed as the reference frequencies in the particular system. The oscillator 11 may be either a 99 Mhz crystal oscillator or a VCO (indicated by the symbol $-\Delta F$). The oscillator 12 may be considered to be either a 101 Mhz crystal oscillator or a VCO (indicated by the symbol $+\Delta F$). The output of both of the oscillators 11 and 12 are fed through respective amplifiers 13 enroute to the input to individual harmonic generators 14 and 15 respectively. These harmonic generators generate frequencies that are multiples of the original frequency input. For instance, the 99 Mhz channel will have a spectrum line at 990 Mhz as well as other 99 Mhz multiples thereof. The same holds true for the 101 Mhz channel through harmonic generator 15. The outputs of the harmonic generators are then fed to the inputs of mixers 16 and 17 (from harmonic generators 14 and 15, respectively) and are mixed with the output frequency from VCO 18. Accordingly, the outputs of mixers 16 and 17 are the difference frequencies between the frequency of the VCO 18 and each line of the corresponding harmonic generator spectrum.

The output from each mixer is delivered to a respective low pass filter 19 in order to eliminate the higher difference frequencies thereby limiting the input to each associated amplifier 20 to the frequency equal to the difference between the VCO frequency and the nearest spectrum line. For example, with the VCO locked at 1,000 Mhz, mixer 16 (the mixer in the 99 Mhz channel) would have a 10 Mhz output due to the mixing with 990 Mhz. Likewise, there would be a 10 Mhz output from mixer 17 (the 101 Mhz channel mixer) due to the mixing of the 1,000 Mhz with 1,010 Mhz. These frequencies (the above mentioned difference frequencies) are then delivered to the phase frequency detector 21 through amplifiers 22 via line 20*a* and 20*b*.

As will be seen, if the VCO were to shift downward in frequency, the output of the mixer 16 (99 Mhz channel) would become less in frequency while the frequency output of the mixer 17 (101 Mhz channel) accordingly becomes larger. If this information is fed to phase frequency detector 21, it eventually causes the detector output to drive the VCO 18 back to the 1,000 Mhz locked condition.

The operation of the phase frequency detector 21 is suchthat when the phase of one channel (either 99 Mhz or 101 Mhz) begins to lag the phase of the other channel, the output voltage of the detector is driven in a direction so that it in turn drives the output frequency of VCO 18 to a value where the channel frequencies are in phase. In a simple phase detector, a VCO has to be virtually "in lock" in order to "lock up." As a result, the use of a phase frequency detector enables the VCO to be pulled within a "capture range."

It is of interest to note that the output of a phase detector is directly related to the phases of at least two input signals. A prior art concept of designing a phase locked loop was based on being able to assure that the VCO would or could be within capture range of the phase locked loop. Since then, digital circuits have been developed which furnish information as to which frequency is the higher (of the two input signals) and which cause the output voltage of some to go to either the high level or to the low level depending on which frequency is higher. These level extremes cause the VCO to be moved in frequency toward the locked point thereby greatly easing the burden of the design engineer since a single chip (integrated circuit) may provide all of this information. At least one such chip is now manufactured by the Motorola Corporation under the designation MC4044.

The circuitry located within the rectangular broken line identified by the letter A makes a decision as to whether the VCO 18 has locked at the midpoint of the two proper harmonics of the reference oscillators 11 and 12. For instance, it is possible that VCO 18 may lock at the midpoint between the 11th harmonic of the 99 and 101 Mhz oscillators. If lock occurred at this particular harmonic (and there is nothing in the loop to prevent it), the lock point output of the mixers would be 11 Mhz rather than 10 Mhz.

In operation, a 10 Mhz mixer output at the lock point will cause same to be divided by two (2) in circuit 23 and from thence to a divide by N circuit (shown also as a divide by 10 circuit) which would conventionally result in a 0.5 Mhz frequency output of same if the divide by N circuit were equal to 10. Accordingly, a total division of 20 has been accomplished. This frequency is then compared to a reference input frequency in order to establish whether the VCO (18) frequency is above or below the desired value. For instance, a 10 Mhz mixer output at a lock point would be divided into a 0.5 Mhz frequency and compared with a 0.5 Mhz reference input to frequency comparator 25. Comparator 25 would then indicate the proper condition of the mixer outputs, that being 10 Mhz. If, for example, the VCO 18 had locked at 1,100 Mhz, then the 11 Mhz output to the division circuits would have resulted in a frequency to frequency comparator 25 that would not equal to the 0.5 Mhz reference frequency. Therefore, frequency comparator 25 would then have an output indicative of a frequency difference so that appropriate circuitry can be activated to cause the VCO 18 to shift downward in frequency toward the proper lock point at 10 Mhz. Stated another way, frequency comparator 25 makes a decision as to whether VCO 18 has locked to a proper lock point. If it is not properly locked, the VCO is caused to sweep in frequency until it does lock at the proper value. It is important to note that as the VCO locks at the midpoint between the lines of the harmonic generators, the difference frequencies out of the mixers are always different. Further, since the difference frequencies are known for each situation, the use of a "divide by N" circuit would cause the VCO to lock at the midpoint of any of the harmonics or to a selected harmonic as determined by the programming of a divide by N circuit.

It is contemplated that the above-described circuitry could be used to cause the output of the VCO 18 to be used as a mixing frequency in a counter. The prior art counters generally utilized a mixing frequency that was generated by first multiplying the harmonic generator by a reference frequency in the lower VHF ranges and then filtering out the desired harmonic by use of a mechanical filter which was often hand tuned. This particular circuitry would enable the VCO output to move in frequency and to lock at desired frequencies in the same manner as the output of the mechanical filters of previous designs.

The DME transponder test set and frequency generation scheme is generally shown by the entire representation of FIG. 1. For descriptive purposes, the 99 and 101 Mhz oscillators are now considered to be VCOs (instead of crystal controlled oscillators) and are respectively identified as a $-\Delta$ F VCO and a $+\Delta$ F VCO. This circuitry will operate to generate frequencies that are necessary to reply to a DME that is being tested in order to ascertain if the tested DME is functioning properly. This test circuit will actually generate the ground reply frequencies that the DME would experience in actual use. For example, the test circuit will generate reply and squitter pulses as well as the "ident" (identification) pulses which have been described in detail in the Patent to John L. Aker, U.S. Pat. No. 3,412,400, issued Nov. 19, 1968. The reply pulses may be delayed by an amount determined by a range delay as programmed into the test circuitry and will include a variable pulse P1, P2 spacing to check the DME under test pulse spacing decoding circuitry and other related test functions.

The portion of the FIG. 1 to the left of center line 10 is the required circuitry to control the $-\Delta$ F VCO 11 and the + F VCO 12. While the previous discussion pertained to the use of fixed oscillator frequencies to drive the harmonic generators 14 and 15, these fixed frequency oscillators may now be thought of as VCOs operating to lock UHF VCO 18 at all of the desired frequencies for DME testing purposes. Usually, the normal test frequencies increments will be comprised of one Mhz channels or even Mhz channels between 962 and 1,313 Mhz. Additionally, the + and − Δ F VCOs can be slewed in frequency thereby causing UHF VCO 18 to lock on frequencies other than the even Mhz increments. Accordingly, the testing of a DME under test receiver band width is facilitated. For instance, to determine the three (3) DB band width of the DME under test, the + Δ F VCOs may be made to deviate a known amount and the three (3) DB band width may be determined from available information. Therefore, when it is desirable to test a DME in order to ascertain its three DB down band width, the Δ F VCOs may be deviated to a point where the sensitivity of the tested DME is degraded by three (3) DB thereby indicating that three DB band width. In other words, the versatility of the circuit in DME testing is enhanced due to the fact that a variable frequency can be used to shift the frequency of the output VCO.

There are two frequency select inputs 30 and 31, shown at the left-hand portion of the circuit which program the + and − Δ F VCO phase locked loops and cause them to lock at the required frequencies. These frequencies, in turn, direct UHF VCO 18 to lock at the desired frequency as determined by the frequency select control inputs. The frequency select inputs program the programmable dividers 32 and 33 so that by the division of the variable frequency, the Δ F VCOs will lock at the desired frequency.

In describing the operation of the F phase locked loops, it is stressed that both loops operate in an identical fashion and that a single description of, for example, the − Δ F phase locked loop will sufficiently disclose the subject invention. An example of a typical operation may require the UHF VCO 18 to lock at 1,000 Mhz and accordingly the − Δ F VCO would lock to 99 Mhz while the + Δ F VCO would lock at 101 Mhz. Of course other frequencies could be specified and the 1,000 Mhz output is merely selected for descriptive purposes.

The − F VCO frequency is delivered via line 34 to mixer 35 and is mixed with an 89 Mhz crystal control oscillator signal from oscillator 36 thusly resulting in a 10 Mhz output at the stated 99 Mhz reference frequency. Again, assuming a 1,000 Mhz lock on frequency the 10 Mhz output from mixer 35 is filtered in low pass filter 37, amplified by amplifier 38 and delivered to the divide by 20 circuit 39 where a signal division is accomplished before same is fed to the input of the programmable divider 32. At divider 32, the frequency of the input signal is eventually reduced to a 5 Khz value. When the VCO is locked, the variable signal delivered to the programmable divider 32 will correspond with a 5 Khz reference signal, same being the output of the divide by 200 circuit 39*a* which performs the division on the 1 Mhz signal input shown on line 40. The 5 Khz reference signal output from the divide by 200 circuit 39*a* and the variable signal from the programmable divider 32 are compared in the phase frequency detector 41 with same having an output amplified at 42 and eventually delivered in the form of a tuning voltage via line 43 to the input of the − Δ F VCO. Of course, this tuning voltage will operate on the VCO in the conventional manner to cause same to lock onto the desired frequency.

In the operating mode, whereby the generator output (the output from UHF VCO 18) will be an even valued 1 Mhz increments, the signal from a 2 Mhz crystal control oscillator 44, after being divided by two (2) in circuit 45 is delivered to the divide by 200 circuit 39*a* via the switch 46 and related contacts. Accordingly, this circuitry provides the 5 Khz reference frequency input to phase frequency detector 41 when the switch 46 is in the calibrate (CAL) position as shown in FIG. 1.

When UHF VCO 18 is to be deviated from an even Mhz frequency, the switch is thrown to the "UNCAL" (uncalibrated) position connecting a 1 Mhz BFO frequency to the divide by 200 circuit via switch 46. As the 1 Mhz VFO is deviated from 1 Mhz reference frequency, the phase frequency detector deviates from 5 Khz. This causes the + Δ F VCO's to deviate from (in this instance) a 90 Mhz and 101 Mhz frequencies. This deviation, in turn, causes the UHF VCO to deviate from 1,000 megacycles.

In the above-described test generator, the deviation of the VFO 1 Mhz frequency is determined by mixing same with the output of the 2 Mhz crystal control oscillator 44. This difference frequency is then fed to a counter (not shown) and the counter output is displayed in the front panel of the test generator. Thus, the test set directly displays the deviation of the UHF VCO from the 1 Mhz increment that is programmed to by a frequency select control. This is a very useful feature in the test circuit in that an external counter is not needed to determine the VCO frequency when receiver band width measurements are being made.

In summary, the UHF VCO output may be selected by selecting the frequencies of the + and − Δ F VCO by the frequency select control. Also, by substituting the 1 Mhz VFO for the 2 Mhz crystal oscillator 44, the UHF VCO frequency may be made to vary in a continuous manner. Further, it should be noted that the + Δ F VCO control circuitry, which has not been discussed in detail, operates in the same manner with the same type circuit components. Therefore, the above-described generator enables the generation of frequencies in the gigahz ranges in a simple and straightforward manner.

From the foregoing, it will be seen that this invention is one well adapted to attain all of the ends and objects hereinabove set forth together with other advantages which are obvious and which are inherent to the structure.

It will be understood that certain features and subcombinations are of utility and may be employed without reference to other features and subcombinations.

As many possible embodiments may be made of the invention without departing from the scope thereof, it is to be understood that all matter herein set forth or shown in the accompanying drawing is to be interpreted as illustrative and not in a limiting sense.

I claim:

1. A signal generating device for generating a plurality of test signals for avionics equipment, the device comprising:

a voltage controlled oscillator (VCO) having a frequency control input and an output corresponding to said test signals, and phase locked loop means interconnected with said VCO control input for setting said VCO output frequency to a value equal to a predetermined integral multiple of the average value of at least two loop input reference frequencies, the phase locked loop comprising:

a first harmonic signal mixer means for generating a first loop input reference frequency and for utilizing same to produce a first plurality of difference frequencies by producing a plurality of harmonics of said first loop input reference frequency and mixing said harmonics with said VCO frequency, a second harmonic signal mixer means for generating a second loop input reference frequency having a frequency greater than said first loop input reference frequency and for utilizing said second loop input reference frequency to produce a second plurality of difference frequencies by producing a plurality of harmonics of said second loop input reference frequency and mixing said last mentioned harmonics with said VCO frequency, first low pass filter means interconnected with said first harmonic signal mixer means for filtering said first plurality of difference frequencies, said filter means having an output, second low pass filter means interconnected with said second harmonic signal mixer means for filtering said second plurality of difference frequencies, said second filter means having an output, and phase comparator means for comparing said first filter means output with said second filter means output, said phase comparator means interconnected to said VCO frequency control input and operable to lock said VCO to a predetermined frequency such that the frequency of said first filter means output is the same as the frequency of said second filter means output.

2. The combination as in claim 1 wherein said first and second harmonic signal mixer means comprise:

oscillator means for generating a loop input reference frequency, harmonic generation means interconnected with said oscillator means for outputting a plurality of harmonics of said loop input reference frequency, and mixer means for generating a plurality of difference frequencies by mixing said harmonics outputted by said harmonic generation means with said VCO output.

3. The combination as in claim 1 including means for varying said VCO frequency by varying the predetermined integral multiple of the average value of said loop input reference frequencies to which said VCO operating frequency corresponds.

4. The combination as in claim 3 wherein said means for varying said VCO frequency comprises:

means for dividing down the output frequency of said second low pass filter means to thereby generate a divided frequency output, means for comparing said divided frequency output with an externally generated reference input frequency, and means actuated by said frequency comparing means for selecting a VCO operating frequency such that the frequency of said divided frequency output equals the frequency of said externally generated reference input frequency.

5. The combination as in claim 2, including means for varying the operating frequency of said loop input reference oscillators to thereby change the VCO operating frequency.

6. The combination as in claim 3, including means for varying the operating frequency of said loop input reference oscillators to thereby change the VCO operating frequency.

* * * * *